(12) United States Patent
Yatskov

(10) Patent No.: US 8,820,395 B2
(45) Date of Patent: Sep. 2, 2014

(54) COOLING SYSTEMS AND HEAT EXCHANGERS FOR COOLING COMPUTER COMPONENTS

(75) Inventor: Alexander I. Yatskov, Kenmore, WA (US)

(73) Assignee: Cray Inc., Seattle, WA (US)

( * ) Notice: Subject to any disclaimer, the term of this patent is extended or adjusted under 35 U.S.C. 154(b) by 213 days.

(21) Appl. No.: 12/862,002

(22) Filed: Aug. 24, 2010

(65) Prior Publication Data
US 2010/0317279 A1    Dec. 16, 2010

Related U.S. Application Data

(62) Division of application No. 11/958,114, filed on Dec. 17, 2007, now abandoned.

(51) Int. Cl.
| | | |
|---|---|---|
| *F28F 9/02* | (2006.01) | |
| *F28D 1/04* | (2006.01) | |
| *F28F 1/02* | (2006.01) | |
| *H05K 7/20* | (2006.01) | |
| *F28D 1/053* | (2006.01) | |
| *F28D 21/00* | (2006.01) | |

(52) U.S. Cl.
CPC .... *F28D 1/05383* (2013.01); *F28D 2021/0064* (2013.01); *F28D 1/0426* (2013.01); *F28F 1/022* (2013.01); *H05K 7/20572* (2013.01)
USPC .......................................................... 165/176

(58) Field of Classification Search
CPC .................. F28D 7/06; F28D 1/05383; F28D 2021/0064; F28D 1/0426; F28B 1/00; F28F 1/022
USPC ........... 165/104.33, 140, 173–175, 172, 163, 165/176; 361/690
See application file for complete search history.

(56) References Cited

U.S. PATENT DOCUMENTS

| | | | |
|---|---|---|---|
| 2,628,018 | A | 2/1953 | Koch |
| 2,673,721 | A | 3/1954 | Dickinson |
| 2,861,782 | A | 11/1958 | Swartz |

(Continued)

FOREIGN PATENT DOCUMENTS

| | | | |
|---|---|---|---|
| JP | 2197195 A | 8/1990 | |
| JP | 07-030275 A | 1/1995 | |

(Continued)

OTHER PUBLICATIONS

U.S. Appl. No. 12/763,977, filed Apr. 20, 2010, Doll.

(Continued)

*Primary Examiner* — Frantz Jules
*Assistant Examiner* — Emmanuel Duke
(74) *Attorney, Agent, or Firm* — Perkins Coie LLP

(57) ABSTRACT

Computer systems having heat exchangers for cooling computer components are disclosed herein. The computer systems include a computer cabinet having an air inlet, an air outlet spaced apart from the air inlet, and a plurality of computer module compartments positioned between the air inlet and the air outlet. The air inlet, the air outlet, and the computer module compartments define an air flow path through the computer cabinet. The computer systems also include a heat exchanger positioned between two adjacent computer module compartments. The heat exchanger includes a plurality of heat exchange elements canted relative to the air flow path.

8 Claims, 4 Drawing Sheets

(56) References Cited

U.S. PATENT DOCUMENTS

| Patent | Kind | Date | Inventor | Ref |
|---|---|---|---|---|
| 3,120,166 | A | 2/1964 | Lyman | |
| 3,192,306 | A | 6/1965 | Skonnord | |
| 3,236,296 | A | 2/1966 | Dubin | |
| 3,317,798 | A | 5/1967 | Chu et al. | |
| 3,348,609 | A | 10/1967 | Dubin et al. | |
| 3,525,385 | A | 8/1970 | Liebert | |
| 3,559,728 | A | 2/1971 | Lyman et al. | |
| 3,648,754 | A | 3/1972 | Sephton | |
| 3,903,404 | A | 9/1975 | Beall et al. | |
| 3,942,426 | A | 3/1976 | Binks et al. | |
| 4,016,357 | A | 4/1977 | Abrahamsen | |
| 4,158,875 | A | 6/1979 | Tajima et al. | |
| 4,261,519 | A | 4/1981 | Ester | |
| 4,270,362 | A | 6/1981 | Lancia et al. | |
| 4,271,678 | A | 6/1981 | Liebert | |
| 4,306,613 | A | 12/1981 | Christopher | |
| 4,313,310 | A | 2/1982 | Kobayashi et al. | |
| 4,315,300 | A | 2/1982 | Parmerlee et al. | |
| 4,386,651 | A | 6/1983 | Reinhard | |
| 4,449,579 | A | 5/1984 | Miyazaki et al. | |
| 4,458,296 | A | 7/1984 | Bryant et al. | |
| 4,473,382 | A | 9/1984 | Cheslock | |
| 4,513,351 | A | 4/1985 | Davis et al. | |
| 4,528,614 | A | 7/1985 | Shariff et al. | |
| 4,535,386 | A | 8/1985 | Frey, Jr. et al. | |
| 4,600,050 | A | 7/1986 | Noren | |
| 4,642,715 | A | 2/1987 | Ende | |
| 4,644,443 | A | 2/1987 | Swensen et al. | |
| 4,691,274 | A | 9/1987 | Matouk et al. | |
| 4,702,154 | A | 10/1987 | Dodson | |
| 4,728,160 | A | 3/1988 | Mondor et al. | |
| 4,767,262 | A | 8/1988 | Simon | |
| 4,774,631 | A | 9/1988 | Okuyama et al. | |
| 4,797,783 | A | 1/1989 | Kohmoto et al. | |
| 4,798,238 | A | 1/1989 | Ghiraldi | |
| 4,802,060 | A | 1/1989 | Immel | |
| 4,860,163 | A | 8/1989 | Sarath | |
| 4,874,127 | A | 10/1989 | Collier | |
| 4,901,200 | A | 2/1990 | Mazura | |
| 4,911,231 | A | 3/1990 | Horne et al. | |
| 4,993,482 | A | 2/1991 | Dolbear et al. | |
| 5,000,079 | A | 3/1991 | Mardis | |
| 5,019,880 | A | 5/1991 | Higgins, III | |
| 5,035,628 | A | 7/1991 | Casciotti et al. | |
| 5,060,716 | A | 10/1991 | Heine | |
| 5,090,476 | A | 2/1992 | Immel | |
| 5,101,320 | A | 3/1992 | Bhargava et al. | |
| 5,131,233 | A | 7/1992 | Cray et al. | |
| 5,150,277 | A | 9/1992 | Bainbridge et al. | |
| 5,161,087 | A | 11/1992 | Frankeny et al. | |
| 5,165,466 | A | 11/1992 | Arbabian | |
| 5,168,925 | A * | 12/1992 | Suzumura et al. | 165/176 |
| 5,174,373 | A * | 12/1992 | Shinmura | 165/176 |
| 5,196,989 | A | 3/1993 | Zsolnay | |
| 5,263,538 | A | 11/1993 | Amidieu et al. | |
| 5,273,438 | A | 12/1993 | Bradley et al. | |
| 5,297,990 | A | 3/1994 | Renz et al. | |
| 5,323,847 | A | 6/1994 | Koizumi et al. | |
| 5,326,317 | A | 7/1994 | Ishizu et al. | |
| 5,329,425 | A | 7/1994 | Leyssens et al. | |
| 5,339,214 | A | 8/1994 | Nelson | |
| 5,345,779 | A | 9/1994 | Feeney | |
| 5,365,402 | A | 11/1994 | Hatada et al. | |
| 5,376,008 | A | 12/1994 | Rodriguez | |
| 5,395,251 | A | 3/1995 | Rodriguez et al. | |
| 5,402,313 | A | 3/1995 | Casperson et al. | |
| 5,410,448 | A | 4/1995 | Barker, III et al. | |
| 5,414,591 | A | 5/1995 | Kimura et al. | |
| 5,467,250 | A | 11/1995 | Howard et al. | |
| 5,467,609 | A | 11/1995 | Feeney | |
| 5,471,850 | A | 12/1995 | Cowans | |
| 5,491,310 | A | 2/1996 | Jen | |
| 5,493,474 | A | 2/1996 | Schkrohowsky et al. | |
| 5,547,272 | A | 8/1996 | Paterson et al. | |
| 5,570,740 | A | 11/1996 | Flores et al. | |
| 5,572,403 | A | 11/1996 | Mills | |
| 5,603,375 | A | 2/1997 | Salt | |
| 5,603,376 | A | 2/1997 | Hendrix | |
| 5,684,671 | A | 11/1997 | Hobbs et al. | |
| 5,685,363 | A | 11/1997 | Orihira et al. | |
| 5,707,205 | A | 1/1998 | Otsuka et al. | |
| 5,709,100 | A | 1/1998 | Baer et al. | |
| 5,718,628 | A | 2/1998 | Nakazato et al. | |
| 5,749,702 | A | 5/1998 | Datta et al. | |
| 5,782,546 | A | 7/1998 | Iwatare | |
| 5,793,610 | A | 8/1998 | Schmitt et al. | |
| 5,829,676 | A | 11/1998 | Ban et al. | |
| 5,849,076 | A | 12/1998 | Gaylord et al. | |
| 5,880,931 | A | 3/1999 | Tilton et al. | |
| 5,927,386 | A | 7/1999 | Lin | |
| 5,941,303 | A * | 8/1999 | Gowan et al. | 165/176 |
| 5,979,541 | A | 11/1999 | Saito et al. | |
| 6,021,047 | A | 2/2000 | Lopez et al. | |
| 6,024,165 | A | 2/2000 | Melane et al. | |
| 6,026,565 | A | 2/2000 | Giannatto et al. | |
| 6,034,870 | A | 3/2000 | Osborn et al. | |
| 6,039,414 | A | 3/2000 | Melane et al. | |
| 6,046,908 | A | 4/2000 | Feng | |
| 6,052,278 | A | 4/2000 | Tanzer et al. | |
| 6,104,608 | A | 8/2000 | Casinelli et al. | |
| 6,115,242 | A | 9/2000 | Lambrecht | |
| 6,132,171 | A | 10/2000 | Fujinaka et al. | |
| 6,135,875 | A | 10/2000 | French | |
| 6,158,502 | A | 12/2000 | Thomas | |
| 6,164,369 | A | 12/2000 | Stoller | |
| 6,167,948 | B1 | 1/2001 | Thomas | |
| 6,182,787 | B1 | 2/2001 | Kraft et al. | |
| 6,183,196 | B1 | 2/2001 | Fujinaka | |
| 6,185,098 | B1 | 2/2001 | Benavides | |
| 6,205,796 | B1 | 3/2001 | Chu et al. | |
| 6,208,510 | B1 | 3/2001 | Trudeau et al. | |
| 6,223,812 | B1 * | 5/2001 | Gough | 165/173 |
| 6,236,564 | B1 | 5/2001 | Fan | |
| 6,272,012 | B1 | 8/2001 | Medin et al. | |
| 6,305,180 | B1 | 10/2001 | Miller et al. | |
| 6,310,773 | B1 | 10/2001 | Yusuf et al. | |
| 6,328,100 | B1 * | 12/2001 | Haussmann | 165/176 |
| 6,332,946 | B1 | 12/2001 | Emmett et al. | |
| 6,351,381 | B1 | 2/2002 | Bilski et al. | |
| 6,359,779 | B1 | 3/2002 | Frank, Jr. et al. | |
| 6,361,892 | B1 | 3/2002 | Ruhl et al. | |
| 6,396,684 | B2 | 5/2002 | Lee | |
| 6,416,330 | B1 | 7/2002 | Yatskov et al. | |
| 6,421,240 | B1 | 7/2002 | Patel | |
| 6,435,266 | B1 | 8/2002 | Wu | |
| 6,439,340 | B1 | 8/2002 | Shirvan | |
| 6,462,944 | B1 | 10/2002 | Lin | |
| 6,481,527 | B1 | 11/2002 | French et al. | |
| 6,501,652 | B2 | 12/2002 | Katsui | |
| 6,515,862 | B1 | 2/2003 | Wong et al. | |
| 6,519,955 | B2 | 2/2003 | Marsala | |
| 6,524,064 | B2 | 2/2003 | Chou et al. | |
| 6,536,510 | B2 | 3/2003 | Khrustalev et al. | |
| 6,542,362 | B2 | 4/2003 | Lajara et al. | |
| 6,546,998 | B2 * | 4/2003 | Oh et al. | 165/110 |
| 6,550,530 | B1 | 4/2003 | Bilski | |
| 6,554,697 | B1 | 4/2003 | Koplin | |
| 6,557,357 | B2 | 5/2003 | Spinazzola et al. | |
| 6,557,624 | B1 | 5/2003 | Stahl et al. | |
| 6,564,571 | B2 | 5/2003 | Feeney | |
| 6,564,858 | B1 | 5/2003 | Stahl et al. | |
| 6,582,192 | B2 | 6/2003 | Tseng et al. | |
| 6,587,340 | B2 | 7/2003 | Grouell et al. | |
| 6,609,592 | B2 | 8/2003 | Wilson | |
| 6,621,698 | B2 | 9/2003 | Chang | |
| 6,628,520 | B2 | 9/2003 | Patel et al. | |
| 6,631,078 | B2 | 10/2003 | Alcoe et al. | |
| 6,644,384 | B2 | 11/2003 | Stahl | |
| 6,646,879 | B2 | 11/2003 | Pautsch | |
| 6,661,660 | B2 | 12/2003 | Prasher et al. | |
| 6,679,081 | B2 | 1/2004 | Marsala | |
| 6,684,457 | B2 | 2/2004 | Holt | |
| 6,690,576 | B2 | 2/2004 | Clements et al. | |
| 6,695,041 | B2 | 2/2004 | Lai et al. | |

(56) References Cited

U.S. PATENT DOCUMENTS

| | | | |
|---|---|---|---|
| 6,705,625 B2 | 3/2004 | Holt et al. | |
| 6,714,412 B1 | 3/2004 | Chu et al. | |
| 6,724,617 B2 | 4/2004 | Amaike et al. | |
| 6,725,912 B1 * | 4/2004 | Moll et al. | 165/144 |
| 6,742,068 B2 | 5/2004 | Gallagher et al. | |
| 6,742,583 B2 | 6/2004 | Tikka | |
| 6,745,579 B2 | 6/2004 | Spinazzola et al. | |
| 6,755,280 B2 | 6/2004 | Porte et al. | |
| 6,761,212 B2 | 7/2004 | DiPaolo | |
| 6,772,604 B2 | 8/2004 | Bash et al. | |
| 6,775,137 B2 | 8/2004 | Chu et al. | |
| 6,776,707 B2 | 8/2004 | Koplin | |
| 6,789,613 B1 * | 9/2004 | Ozaki et al. | 165/140 |
| 6,796,372 B2 | 9/2004 | Bear | |
| 6,801,428 B2 | 10/2004 | Smith et al. | |
| 6,819,563 B1 | 11/2004 | Chu et al. | |
| 6,836,407 B2 | 12/2004 | Faneuf et al. | |
| 6,854,287 B2 | 2/2005 | Patel et al. | |
| 6,854,659 B2 | 2/2005 | Stahl et al. | |
| 6,860,713 B2 | 3/2005 | Hoover | |
| 6,867,966 B2 * | 3/2005 | Smith et al. | 361/679.48 |
| 6,875,101 B1 | 4/2005 | Chien | |
| 6,876,549 B2 | 4/2005 | Beitelmal et al. | |
| 6,881,898 B2 | 4/2005 | Baker et al. | |
| 6,882,531 B2 | 4/2005 | Modica | |
| 6,896,095 B2 | 5/2005 | Shah et al. | |
| 6,904,968 B2 | 6/2005 | Beitelmal et al. | |
| 6,909,611 B2 | 6/2005 | Smith et al. | |
| 6,914,780 B1 | 7/2005 | Shanker et al. | |
| 6,932,443 B1 | 8/2005 | Kaplan et al. | |
| 6,952,667 B2 | 10/2005 | Kempe | |
| 6,964,296 B2 * | 11/2005 | Memory et al. | 165/151 |
| 6,975,510 B1 | 12/2005 | Robbins et al. | |
| 6,992,889 B1 | 1/2006 | Kashiwagi et al. | |
| 6,997,245 B2 | 2/2006 | Lindemuth et al. | |
| 6,997,741 B2 | 2/2006 | Doll et al. | |
| 6,999,316 B2 | 2/2006 | Hamman | |
| 7,016,191 B2 | 3/2006 | Miyamoto et al. | |
| 7,046,513 B2 | 5/2006 | Nishiyama et al. | |
| 7,051,802 B2 | 5/2006 | Baer | |
| 7,051,946 B2 | 5/2006 | Bash et al. | |
| 7,059,899 B2 | 6/2006 | Doll et al. | |
| 7,114,555 B2 | 10/2006 | Patel et al. | |
| 7,120,017 B2 | 10/2006 | Shieh | |
| 7,120,027 B2 | 10/2006 | Yatskov et al. | |
| 7,123,477 B2 | 10/2006 | Coglitore et al. | |
| 7,133,285 B2 | 11/2006 | Nishimura | |
| 7,144,320 B2 | 12/2006 | Turek et al. | |
| 7,152,418 B2 | 12/2006 | Alappat et al. | |
| 7,152,668 B2 * | 12/2006 | Hoffmann et al. | 165/110 |
| 7,154,748 B2 | 12/2006 | Yamada | |
| 7,177,156 B2 | 2/2007 | Yatskov et al. | |
| 7,182,208 B2 | 2/2007 | Tachibana | |
| 7,185,696 B2 | 3/2007 | Schaper | |
| 7,187,549 B2 | 3/2007 | Teneketges et al. | |
| 7,193,846 B1 | 3/2007 | Davis et al. | |
| 7,193,851 B2 | 3/2007 | Yatskov | |
| 7,209,351 B2 | 4/2007 | Wei | |
| 7,215,552 B2 | 5/2007 | Shipley et al. | |
| 7,218,516 B2 | 5/2007 | Yu et al. | |
| 7,222,660 B2 | 5/2007 | Giacoma et al. | |
| 7,226,353 B2 | 6/2007 | Bettridge et al. | |
| 7,227,751 B2 | 6/2007 | Robbins et al. | |
| 7,242,579 B2 | 7/2007 | Fernandez et al. | |
| 7,255,640 B2 | 8/2007 | Aldag et al. | |
| 7,259,963 B2 | 8/2007 | Germagian et al. | |
| 7,286,351 B2 | 10/2007 | Campbell et al. | |
| 7,304,842 B2 | 12/2007 | Yatskov | |
| 7,312,985 B2 | 12/2007 | Lee et al. | |
| 7,314,113 B2 | 1/2008 | Doll | |
| 7,315,448 B1 | 1/2008 | Bash et al. | |
| 7,318,322 B2 | 1/2008 | Ota et al. | |
| 7,330,350 B2 | 2/2008 | Hellriegel et al. | |
| 7,362,571 B2 | 4/2008 | Kelley et al. | |
| 7,365,976 B2 | 4/2008 | Fujiya et al. | |
| 7,367,384 B2 | 5/2008 | Madara et al. | |
| 7,382,613 B2 | 6/2008 | Vinson et al. | |
| 7,385,810 B2 | 6/2008 | Chu et al. | |
| 7,397,661 B2 | 7/2008 | Campbell et al. | |
| 7,411,785 B2 | 8/2008 | Doll | |
| 7,418,825 B1 | 9/2008 | Bean, Jr. | |
| 7,420,805 B2 | 9/2008 | Smith et al. | |
| 7,430,118 B1 | 9/2008 | Noteboom et al. | |
| 7,508,663 B2 | 3/2009 | Coglitore | |
| 7,513,923 B1 | 4/2009 | Lewis et al. | |
| 7,534,167 B2 | 5/2009 | Day | |
| 7,542,287 B2 | 6/2009 | Lewis, II et al. | |
| 7,554,803 B2 | 6/2009 | Artman et al. | |
| 7,630,198 B2 | 12/2009 | Doll | |
| 7,641,101 B2 | 1/2010 | Campbell et al. | |
| 7,657,347 B2 | 2/2010 | Campbell et al. | |
| 7,679,909 B2 | 3/2010 | Spearing et al. | |
| 7,707,880 B2 | 5/2010 | Campbell et al. | |
| 7,710,720 B2 | 5/2010 | Fuke et al. | |
| 7,830,658 B2 | 11/2010 | Van Andel | |
| 7,895,854 B2 | 3/2011 | Bash et al. | |
| 8,485,248 B2 * | 7/2013 | Coyle et al. | 165/174 |
| 2002/0072809 A1 | 6/2002 | Zuraw | |
| 2003/0053928 A1 | 3/2003 | Takano | |
| 2004/0008491 A1 | 1/2004 | Chen | |
| 2004/0020225 A1 | 2/2004 | Patel et al. | |
| 2004/0052052 A1 | 3/2004 | Rivera | |
| 2005/0120737 A1 * | 6/2005 | Borror et al. | 62/434 |
| 2005/0161205 A1 | 7/2005 | Ashe et al. | |
| 2005/0186070 A1 | 8/2005 | Zeng et al. | |
| 2005/0207116 A1 * | 9/2005 | Yatskov et al. | 361/690 |
| 2005/0217837 A1 * | 10/2005 | Kudija, Jr. | 165/165 |
| 2005/0241810 A1 | 11/2005 | Malone et al. | |
| 2006/0044758 A1 | 3/2006 | Spangberg | |
| 2006/0102322 A1 * | 5/2006 | Madara et al. | 165/104.21 |
| 2006/0180301 A1 | 8/2006 | Baer | |
| 2007/0030650 A1 | 2/2007 | Madara et al. | |
| 2007/0224084 A1 | 9/2007 | Holmes et al. | |
| 2008/0078202 A1 | 4/2008 | Luo | |
| 2008/0098763 A1 | 5/2008 | Yamaoka | |
| 2008/0112128 A1 | 5/2008 | Holland | |
| 2008/0158814 A1 | 7/2008 | Hattori | |
| 2008/0212282 A1 | 9/2008 | Hall et al. | |
| 2008/0216493 A1 | 9/2008 | Lin et al. | |
| 2009/0154091 A1 | 6/2009 | Yatskov | |
| 2009/0201644 A1 | 8/2009 | Kelley et al. | |
| 2009/0236006 A1 | 9/2009 | Farese et al. | |
| 2009/0244826 A1 | 10/2009 | Doll | |
| 2009/0260384 A1 | 10/2009 | Champion et al. | |
| 2010/0097751 A1 | 4/2010 | Doll et al. | |
| 2010/0097752 A1 | 4/2010 | Doll et al. | |
| 2011/0112694 A1 | 5/2011 | Bash et al. | |
| 2012/0008275 A1 | 1/2012 | Doll et al. | |
| 2012/0026691 A1 | 2/2012 | Campbell et al. | |
| 2012/0188706 A1 | 7/2012 | Kelley et al. | |

FOREIGN PATENT DOCUMENTS

| | | |
|---|---|---|
| JP | 2002026548 A | 1/2002 |
| JP | 2002237692 A | 8/2002 |
| JP | 2004079754 | 3/2004 |
| WO | WO-0186217 | 11/2001 |
| WO | WO-2005027609 | 3/2005 |

OTHER PUBLICATIONS

Baer, D.B., "Emerging Cooling Requirements & Systems in Telecommunications Spaces," Telecommunications Energy Conference 2001, Oct. 14-18, 2001, pp. 95-100.

Bleier, F. P., "FAN Handbook, Selection, Application, and Design," McGraw Hill, 1998, pp. 7.50-7.51.

Final Office Action for U.S. Appl. No. 11/958,114, Mail Date Apr. 9, 2010, 28 pages.

Hannemann, R. et al., "Pumped Liquid Multiphase Cooling," ASME, 2004, IMECE 2004, Paper IMECE2004-60669, Anaheim, CA, 5 pages.

(56) References Cited

OTHER PUBLICATIONS

JAMSTEC/Earth Simulator Center, "Processor Node (PN) Cabinet," http://www.es.jamstec.go.jp/esc/eng/Hardware/pnc.html, 1 page, [accessed Mar. 5, 2004].

Liebert Corporation, "Managing Extreme Heat Cooling Strategies for High-Density Computer Systems," Dec. 7, 2003, Columbus, OH, 16 pages.

Marsala, J., "Pumped Liquid/Two Phase Cooling for High Performance Systems," Thermal Form & Function LLC, May 13, 2003, Scottsdale, AZ, 19 pages.

Novel Concepts, Inc., "Heat Spreaders," http://www.novelconceptsinc.com/heat-spreaders.htm, 2 pages [accessed Jun. 14, 2004].

Pitasi, M. "Thermal Management System Using Pumped Liquid R-134a with Two Phase Heat Transfer," Thermal Form & Function LLC, Manchester, MA, Mar. 2002, pp. 1-9, http:/www.coolingzone.com/Guest/News/NL__MAR__2002/TFF/Tff.html.

Thermacore International, Inc., "Frequently Asked Questions about Heat Pipes," http://www.thermacore.com/hpt_faqs.htm, 3 pages [accessed Jun. 14, 2004].

Thermacore Thermal Management Solutions, "Therma-base-Heat Sink," 3 pages, [accessed Jun. 14, 2005].

Thermal Form & Function LLC, "Box/Blade Cooling System," http://www.thermalformandfunction.com/boxsystem.html, Manchester, MA, 2005, 1 page [accessed May 10, 2006].

Thermal Form & Function LLC, "Thermal Form & Function—Rack Cooling System (RCS)," 2005, Manchester, MA, one page, http:/www.thermalformandfunction.com/racksystem.html, [accessed May 11, 2006].

Vogel, M. et al., "Low Profile Heat Sink Cooling Technologies for Next Generation CPU Thermal Designs," *Electronic Cooling Online*, Feb. 17, 2005, 11 pages.

Webb, W., "Take the heat: Cool that hot embedded design," *EDN*, May 13, 2004, 5 pages.

Non-Final Office Action for U.S. Appl. No. 11/371,272, Mail Date Mar. 19, 2009, 13 pages.

Non-Final Office Action for U.S. Appl. No. 11/958,114, Mail Date Aug. 25, 2009, 22 pages.

Non-Final Office Action for U.S. Appl. No. 12/029,124, Mail Date Dec. 11, 2009, 27 pages.

Non-Final Office Action for U.S. Appl. No. 12/060,377, Mail Date Sep. 23, 2009, 10 pages.

Notice of Allowance for U.S. Appl. No. 12/029,124, Mail Date Oct. 28, 2011, 21 pages.

\* cited by examiner

COOLING SYSTEMS AND HEAT EXCHANGERS FOR COOLING COMPUTER COMPONENTS

CROSS-REFERENCE TO APPLICATION(S) INCORPORATED BY REFERENCE

The present application is a divisional of U.S. patent application Ser. No. 11/958,114 filed Dec. 17, 2007 now abandoned, and entitled "COOLING SYSTEMS AND HEAT EXCHANGERS FOR COOLING COMPUTER COMPONENTS," which is incorporated herein in its entirety by reference.

TECHNICAL FIELD

The present disclosure relates generally to cooling systems and heat exchangers for cooling electronic components in computer systems.

BACKGROUND

Supercomputers and other large computer systems typically include a large number of computer modules housed in cabinets arranged in banks. The computer modules are typically positioned in close proximity to each other. During operation, the close proximity can make dissipating heat generated by the modules difficult. If not dissipated, the heat can damage the modules or significantly reduce system performance.

One conventional technique for computer module cooling includes drawing air into the cabinet to cool the computer modules and discharging the heated air to the room. One shortcoming of this technique, however, is that the heat capacity of the cooling air can quickly become saturated. As a result, some of the computer modules may not be adequately cooled. Accordingly, there is a need to effectively dissipate heat generated by computer modules during operation.

DETAILED DESCRIPTION

The following disclosure describes several embodiments of cooling systems for use with supercomputers and/or other computer systems. Persons of ordinary skill in the art will understand, however, that the invention can have other embodiments with additional features, or without several of the features shown and described below with reference to FIGS. 1-5. In the Figures, identical reference numbers identify structurally and/or functionally identical, or at least generally similar, elements.

Figure 1A:
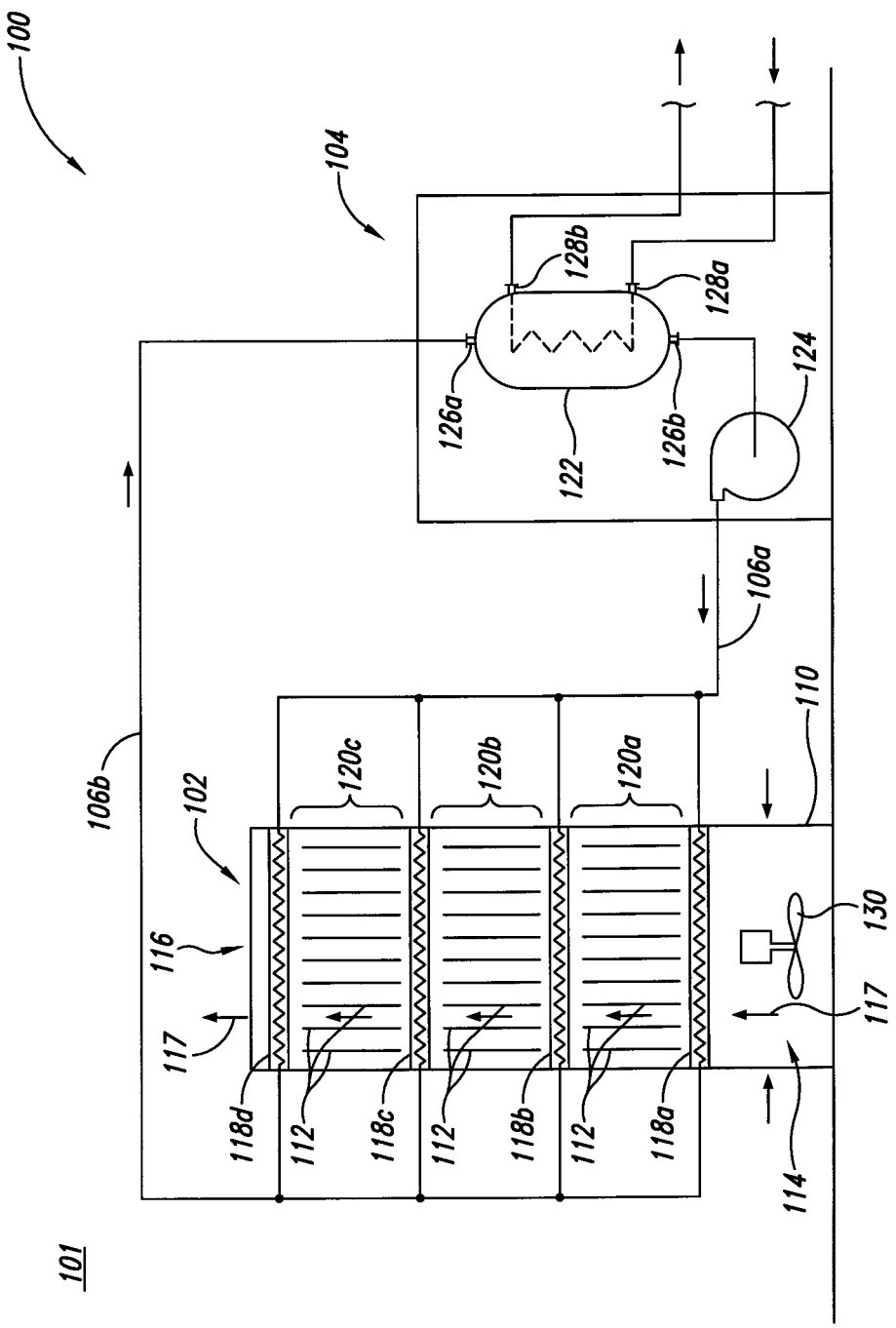
FIG. 1A is a partially schematic elevation view of a computer system having internal heat exchangers configured in accordance with an embodiment of the invention.

FIG. 1A is a partially schematic elevation view of a computer system 100 having a plurality of internal heat exchangers 118 (identified individually as heat exchangers 118a-d) configured in accordance with an embodiment of the invention. The computer system 100 can include a computer cabinet 102 in a room 101. Working fluid lines 106 (identified individually as a supply line 106a and a return line 106b) connect the computer cabinet 102 to a heat removal system 104. In the illustrated embodiment, the heat removal system 104 is situated in the room 101 and spaced apart from the computer cabinet 102. In other embodiments, however, the heat removal system 104 can be integrated into the computer cabinet 102, positioned outside the room 101, or situated in other suitable places.

The computer cabinet 102 can include an air inlet 114 for receiving cooling air from the room 101 or a floor plenum (not shown), an air outlet 116 for discharging air to the room 101, and a plurality of computer module compartments 120 (identified individually as first, second, and third computer module compartments 120a-c, respectively) arranged vertically between the air inlet 114 and the air outlet 116 in a chassis 110. Individual computer module compartments 120 hold a plurality of computer modules 112 oriented edgewise with respect to the flow of cooling air through the chassis 110.

The computer cabinet 102 can also hold a plurality of heat exchangers 118 in the chassis 110. As described in greater detail below with reference to FIGS. 1B-4, the individual heat exchangers 118 can be configured to receive a working fluid (not shown) from the heat removal system 104 via the supply line 106a. After flowing through the heat exchangers 118, the working fluid returns to the heat removal system 104 via the return line 106b. The working fluid can include hydrofluorocarbons, hydrochlorofluorocarbons, chlorofluorocarbons, ammonia, and/or other suitable refrigerants known in the art. The working fluid can include a vapor phase fluid, a liquid phase fluid, or a two-phase fluid when flowing through the heat exchangers 118.

The computer cabinet 102 can additionally include an air mover 130 (e.g., a fan) positioned proximate to the air inlet 114 to facilitate movement of the cooling air through the chassis 110 along a flow path 117. The air mover 130 can draw air from the room 101 or a floor plenum into the chassis 110 through the air inlet 114. The air then flows through the chassis 110 past the computer modules 112, and exits the chassis 110 via the air outlet 116.

The heat removal system 104 can include a pump 124 in fluid communication with a condenser 122. The condenser 122 can be a shell-and-tube type heat exchanger, a plate-and-frame type heat exchanger, or other suitable type of heat exchanger known in the art. The condenser 122 can include a working fluid inlet 126a for receiving heated working fluid returning from the computer cabinet 102, and a working fluid outlet 126b for supplying cooled working fluid to the pump 124. The condenser 122 can also include a coolant inlet 128a and a coolant outlet 128b for circulating chilled water, cooling water, or other suitable coolant (not shown) to cool the working fluid. The pump 124 can include a positive displacement pump, a centrifugal pump, or other suitable type of pump for circulating the working fluid back to the heat exchangers 118 via the supply line 106a.

During operation of the computer system 100, the air mover 130 draws air into the chassis 110 through the air inlet 114. The first heat exchanger 118a cools the air before it flows into the first compartment 120a. As the air flows through the first compartment 120a, the computer modules 112 in the first compartment 120a transfer heat to the air. The second heat exchanger 118b then cools the air before the air passes into the second compartment 120b by absorbing heat from the air into the working fluid. The air is similarly cooled by the third heat exchanger 118c before flowing into the third compartment 120c. The fourth heat exchanger 118d then cools the heated air leaving the third compartment 120c before the air is discharged to the room 101 via the air outlet 116.

In one embodiment, the working fluid is in phase transition between liquid and vapor as the working fluid leaves the heat exchangers 118. In other embodiments, the working fluid can have other phase conditions at this time. The heated working fluid from the heat exchangers 118 returns to the condenser 122 via the return line 106b. The coolant in the condenser 122 cools the working fluid before the pump 124 circulates the working fluid back to the heat exchangers 118.

Only a single computer cabinet 102 is shown in FIG. 1A for purposes of illustration and ease of reference. In other embodiments, however, supercomputers and other large computer systems can include a plurality of computer cabinets arranged in banks or other configurations. In such embodiments, the heat removal system 104 can provide working fluid to one or more of the computer cabinets 102 via an appropriately configured piping circuit. Further, although the heat exchangers 118 have been described above in the context of working fluid-type heat exchangers, in other embodiments, other types of heat exchangers can be used to inter-cool the air moving through the compartments 120 without departing from the spirit or scope of the present invention.

Figure 1B:
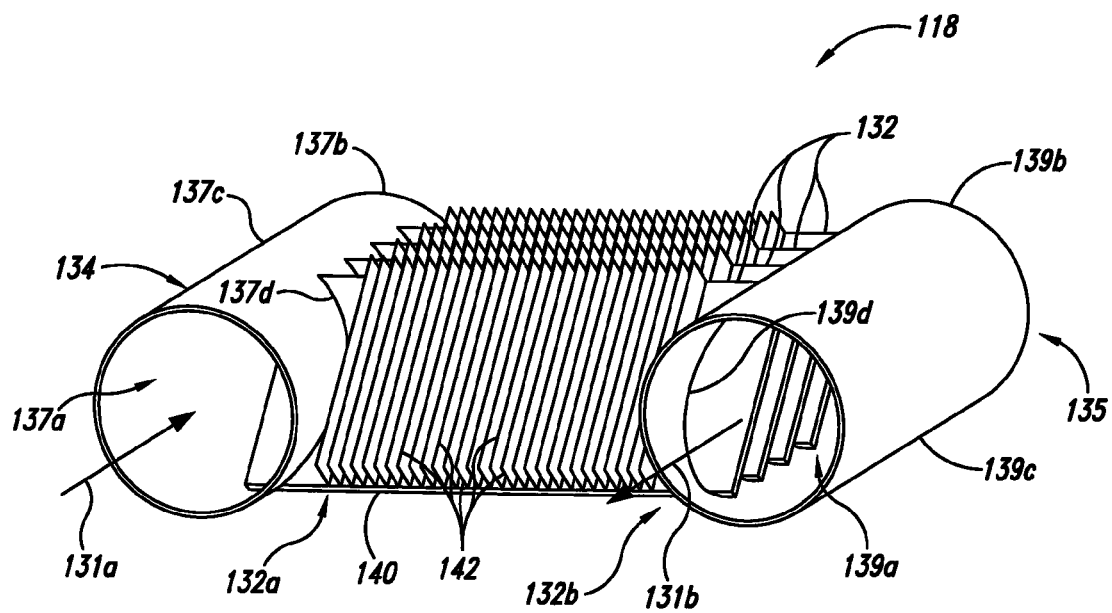
FIG. 1B is an enlarged perspective view of a heat exchanger having canted heat exchange elements configured in accordance with an embodiment of the invention.

FIG. 1B is an enlarged perspective view of one of the heat exchangers 118 configured in accordance with an embodiment of the invention. The heat exchanger 118 can include a plurality of heat exchange elements 132 extending between and in fluid communication with an inlet manifold 134 and an outlet manifold 135. Although four heat exchange elements 132 are shown in FIG. 1B, in other embodiments, the heat exchanger 118 can include more or fewer heat exchange elements 132 depending on a number of factors including heat load, cost, manufacturability, etc.

The inlet manifold 134 can include a distribution section 137c extending between an inlet port 137a and a capped inlet end 137b. In the illustrated embodiment, the distribution section 137c includes a generally tubular structure (e.g., a section of a pipe or a tube) with a plurality of first slots 137d arranged along a length of the distribution section 137c. The first slots 137d are configured to receive first end portions of the heat exchange elements 132. In other embodiments, the distribution section 137c can have other configurations to accommodate other factors.

In the illustrated embodiment, the outlet manifold 135 is generally similar to the inlet manifold 134. For example, the outlet manifold 135 includes a collection section 139c extending between an outlet port 139a and a capped outlet end 139b. The collection section 139c includes a generally tubular structure with a plurality of second slots 139d arranged along a length of the collection section 139c in one-to-one correspondence with the first slots 137d. In other embodiments, the outlet manifold 135 can have other configurations, including others that differ from the inlet manifold 134. For example, the collection section 139c can have a different cross-sectional shape and/or a different size than the distribution section 137c.

The individual heat exchange elements 132 can include a plurality of fins 142 extending from a passage portion 140. A first end portion 132a of the passage portion 140 is coupled to the inlet manifold 134 via the first slots 137d, and a second end portion 132b of the passage portion 140 is coupled to the outlet manifold 135 via the second slots 139d. In the illustrated embodiment, the passage portion 140 extends into both the inlet manifold 134 and the outlet manifold 135. In other embodiments, however, the ends of the passage portion 140 can be generally flush with the first and/or second slots 137d, 139d. Further details of several embodiments of the passage portion 140 are described below with reference to FIG. 1C.

Figure 1C:
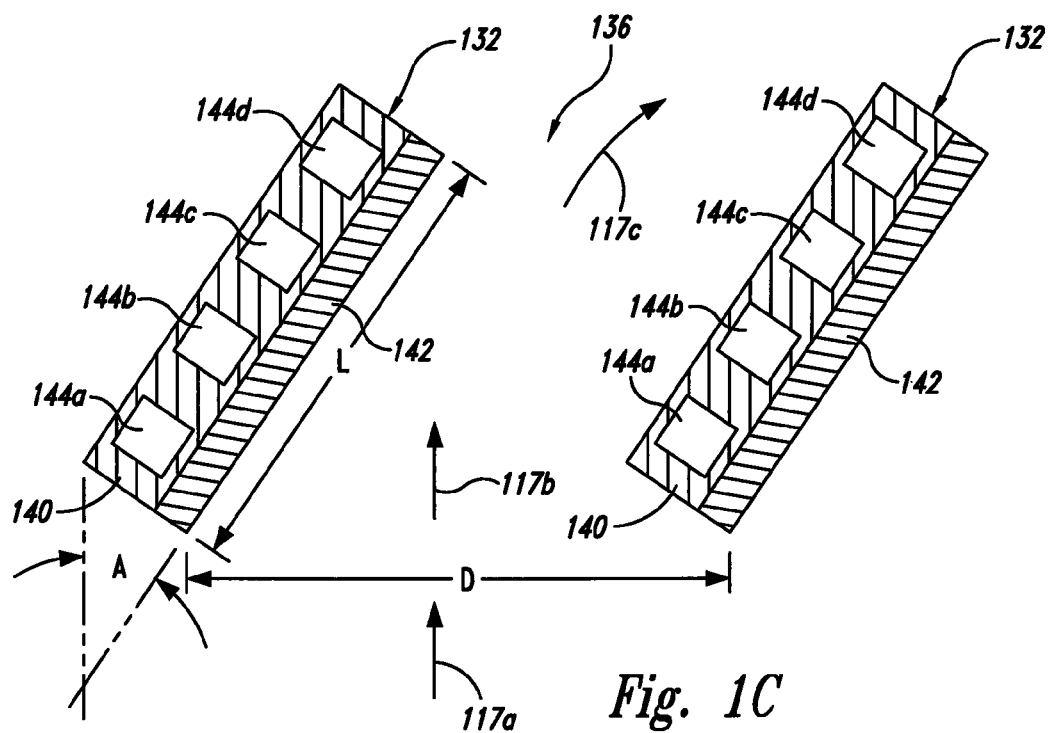
FIG. 1C is an enlarged, cross-sectional side view of two heat exchange elements from the heat exchanger of FIG. 1B, configured in accordance with an embodiment of the invention.

FIG. 1C is an enlarged side view of two of the heat exchange elements 132 of FIG. 1B, configured in accordance with one embodiment of the invention. As illustrated in FIG. 1C, the heat exchange elements 132 can be at least generally parallel to each other with a gap D (e.g., from about 1 cm to about 2 cm, or any other desired spacing) therebetween. In other embodiments, however, at least some of the heat exchange elements 132 can be nonparallel to the other heat exchange elements 132. The gap D can form an air passage 136 in fluid communication with the air flow path 117. The air passage 136 allows cooling air to flow past the heat exchange elements 132 during operation of the computer system 100.

In certain embodiments, individual heat exchange elements 132 can be canted relative to the incoming air flow path 117a. For example, as illustrated in FIG. 1C, the heat exchange elements 132 can form an angle A of from about 10° to about 45°, preferably from about 15° to about 40°, and more preferably about 20° to about 30° relative to the air flow path 117a. In other embodiments, the heat exchange elements 132 and the air flow path 117a can form other suitable angles. Each of the heat exchange elements 132 can form the same angle or different angles relative to the air flow path 117. For example, the angles can increase or decrease (e.g., linearly, exponentially, etc.) from one heat exchange element 132 to another.

The individual heat exchange elements 132 can include a plurality of internal fluid channels 144 (identified individually as first, second, third, and fourth internal channels 144a-d, respectively). In the illustrated embodiment, the internal channels 144 have generally the same cross-sectional shape, e.g., a generally rectangular shape, and generally the same cross-sectional area. In other embodiments, however, the internal channels 144 can have other cross-sectional shapes, such as triangular shapes, circular shapes, oval shapes, and/or other suitable shapes and/or cross-sectional areas. In further embodiments, the internal channels 144 can have non-identical configurations, as described in more detail below with reference to FIG. 2.

Referring to FIG. 1B and FIG. 1C together, in operation, a working fluid (not shown) flows into the inlet manifold 134 via the inlet port 137a, as indicated by the arrow 131a. The inlet manifold 134 distributes the working fluid to the internal channels 144 at the first end 132a of each of the heat exchange elements 132. The working fluid flows across the heat exchange elements 132 from the first end 132a toward the second end 132b. As the working fluid flows across the heat exchange elements 132, the working fluid absorbs heat from cooling air flowing through the air passage 136 and/or past the fins 142. As a result, in one embodiment, the working fluid can be at least partially vaporized (i.e., a two-phase fluid) at the outlet manifold 135. In other embodiments, the working fluid can be sub-cooled at the outlet manifold 135. In further embodiments, the working fluid can be substantially completely vaporized at the outlet manifold 135. In all these embodiments, the collection section 139c of the outlet manifold 135 collects the heated working fluid and returns the heated working fluid to the heat removal system 104 (FIG. 1A) via the outlet port 139a, as indicated by the arrow 131b.

Canting the heat exchange elements 132 can improve heat distribution along a length L (FIG. 1C) of the heat exchange elements 132. For example, as the cooling air flows past the heat exchange elements 132, the working fluid in one of the internal channels 144 (e.g., the fourth internal channel 144d) can absorb heat from air streams that have not been significantly cooled by working fluid flowing through other internal channels 144 (e.g., the first, second, and/or third internal channels 144a-c). As a result, heat distribution along the length L of the heat exchange element 132 can be more efficient than with heat exchange elements arranged parallel to the air flow. The canted heat exchange elements 132 can also increase the heat transfer area without significantly affecting the height of the heat exchanger 118. Furthermore, the canted heat exchange elements 132 can improve energy distribution in the computer cabinet 102 (FIG. 1A) because the canted heat exchange elements 132 can deflect cooling air to other parts of the computer cabinet 102 during operation, as indicated by the arrow 117.

Figure 2:
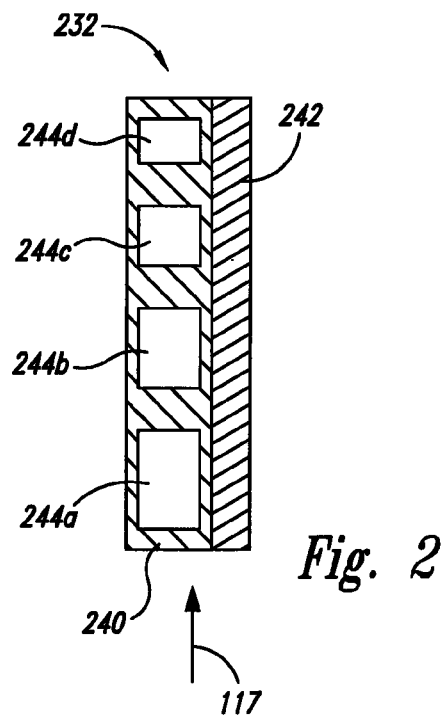
FIG. 2 is a cross-sectional side view of a heat exchange element having non-identical internal channels configured in accordance with another embodiment of the invention.

FIG. 2 is a cross-sectional side view of a heat exchange element 232 having non-identical internal channels configured in accordance with another embodiment of the invention. As illustrated in FIG. 2, the heat exchange element 232 can include a plurality of internal channels 244 (identified individually as first, second, third, and fourth internal channel 244a-d, respectively), and at least one internal channel 244 has a different internal configuration than others. For example, the cross-sectional area of the internal channels 244 can sequentially decrease from the first internal channel 244a to the fourth internal channel 244d. In other embodiments, the first and second internal channels 244a-b can have a first cross-sectional area, and the third and fourth internal channels 244c-d can have a second cross-sectional area, smaller than the first cross-sectional area. As the foregoing illustrates, in further embodiments, the internal channels 244 can have different cross-sectional shapes and/or other arrangements.

In operation, the different internal configurations of the internal channels 244 can allow the working fluid to have different mass flow rates when flowing through the internal channels 244. For example, in the illustrated embodiment, the first internal channel 244a has a larger cross-sectional area than that of the second internal channel 244b. As a result, the mass flow rate of working fluid through the first internal channel 244a will be greater than the mass flow rate of the working fluid through the second internal channel 244b for a given fluid pressure.

Controlling the flow rate of the working fluid flowing through individual internal channels 244 can improve heat transfer performance of the heat exchange element 232. The inventor has recognized that, in certain situations, the working fluid flowing through the first internal channel 244a can be completely vaporized before and/or when it reaches the outlet manifold 135 (FIG. 1B). The completely vaporized working fluid typically cannot efficiently transfer heat because of a low heat capacity. By increasing the flow rate of the working fluid flowing through the first internal channel 244a, the working fluid can be at least a two-phase fluid when it reaches the outlet manifold 135, thus improving the heat transfer efficiency.

In other embodiments, the heat exchange element 232 can include other features that affect the mass flow rate of the working fluid in the internal channels 244. For example, individual internal channels 244 can include an orifice, a nozzle, and/or other flow restricting components. In another example, the heat exchange element 232 can include a barrier (not shown) that partially blocks the cross-section of at least one of the internal channels 244.

Figure 3:
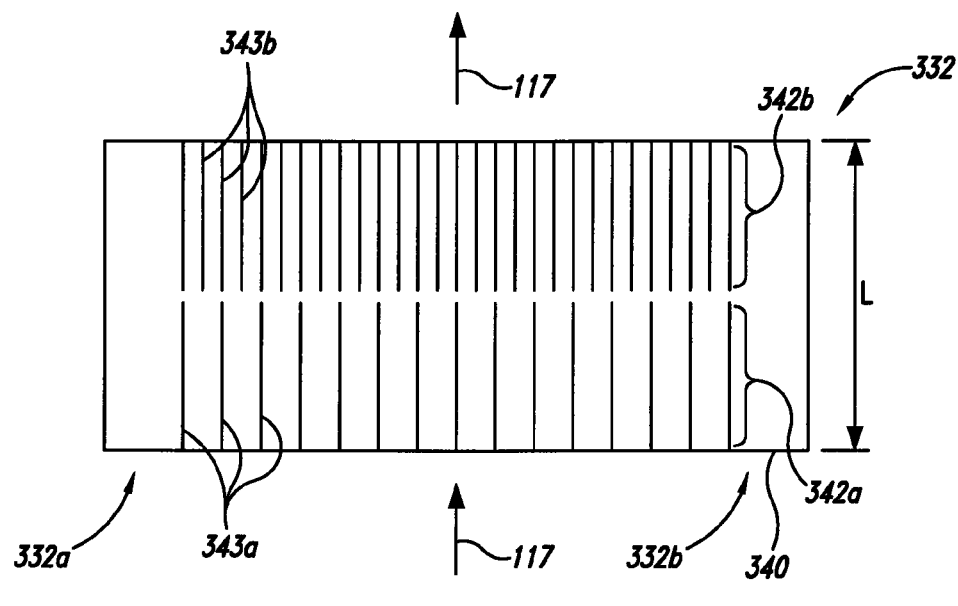
FIG. 3 is a front view of a heat exchange element having a plurality of fin configurations positioned along an air flow path in accordance with another embodiment of the invention.

FIG. 3 is a front view of a heat exchange element 332 having a fin configuration configured in accordance with a further embodiment of the invention. In this embodiment, the heat exchange element 332 includes a first fin portion 342a and a second fin portion 342b arranged along the air flow path 117. The first fin portion 342a can include a plurality of first fins 343a, and the second fin portion 342b can include a plurality of second fins 343b, different than the first fins 343a. For example, in the illustrated embodiment, the second fin portion 342b can have a larger number of fins 343b than the first fin portion 342a. In another embodiment, the second fin portion 342b can include different types of fins than the first fin portion 342a (e.g., the second fins 343b can have different heights, thicknesses, etc). In a further embodiment, the second fins 343b can have a higher heat conductance than the first fins 343a. In any of these embodiments, the second fin portion 342b can have a higher heat transfer coefficient that the first fin portion 342a.

Having different fin configurations along the air flow path 117 can improve the heat transfer efficiency between the working fluid and the cooling air. The inventor has recognized that if the fins have the same configuration along the length L of the heat exchange element 332, the working fluid flowing through the fourth internal channel 144d (FIG. 1C) is likely to be mostly liquid when it reaches the outlet manifold 135 (FIG. 1B). Thus, the heat transfer between the working fluid and the cooling air is limited because the mostly liquid working fluid typically has a latent heat capacity much lower than its heat of vaporization. The inventor has further recognized that the limiting factor in the heat transfer between the working fluid and the cooling air is the heat transfer rate between the fins and the cooling air. Thus, by increasing the heat transfer efficiency and/or capability of the second fin portion 342b, the heat transfer between the working fluid in the fourth internal channel 144d and the cooling air can be improved.

Figure 4:
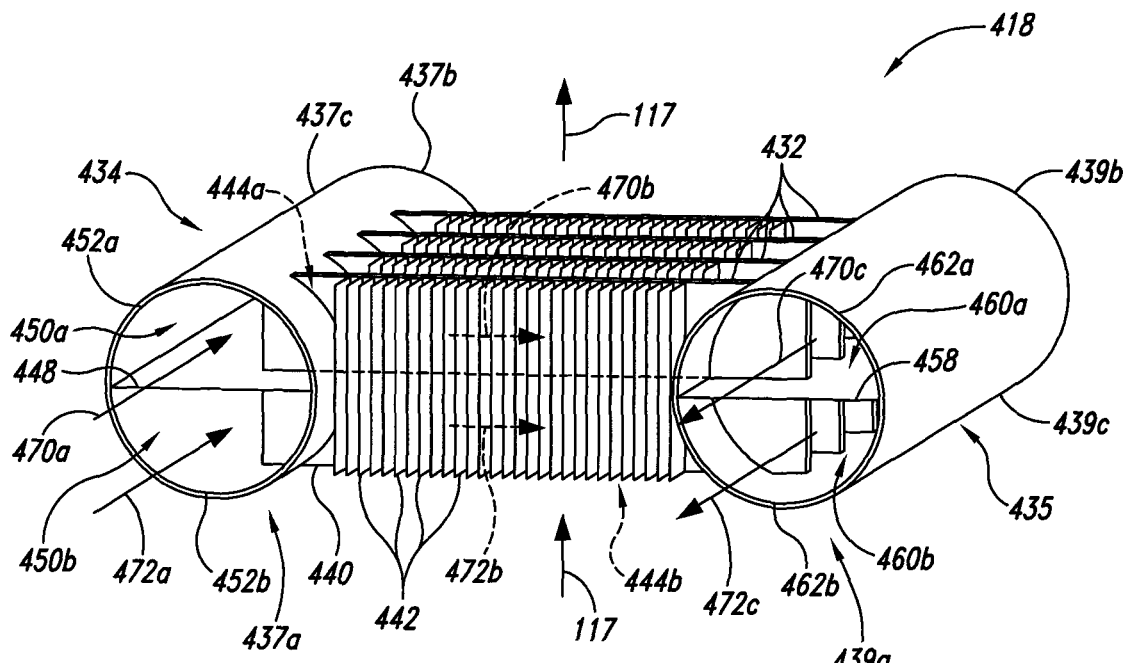
FIG. 4 is a perspective view of a heat exchanger having partitioned inlet and/or outlet manifolds configured in accordance with another embodiment of the invention and suitable for use in the computer system of FIG. 1A.

FIG. 4 is a partially exploded perspective view of a heat exchanger 418 configured in accordance with another embodiment of the invention and suitable for use in the computer system 100 of FIG. 1A. Many features of the heat exchanger 418 can be at least generally similar in structure and function to the heat exchangers 118 describe above. For example, the heat exchanger 418 can include a plurality of heat exchange elements 432 extending between an inlet manifold 434 and an outlet manifold 435. The individual heat exchange elements 432 can include a plurality of fins 442 extending from a passage portion 440. The passage portion 440 can be generally similar to the passage portion 140 of FIGS. 1B and 1C, or the passage portion 240 of FIG. 2.

The inlet manifold 434 can include a distribution section 437c extending between an inlet opening 437a and a capped inlet end 437b. The inlet manifold 434 can also include an inlet divider 448 extending between the inlet opening 437a and the inlet end 437b. The inlet divider 448 separates the distribution section 437c into a first inlet volume 450a and a second inlet volume 450b. The inlet divider 448 also separates the inlet opening 437a into a first inlet port 452a and a second inlet port 452b.

In the illustrated embodiment, the outlet manifold 435 is generally similar to the inlet manifold 434. For example, the outlet manifold 435 includes a collection section 439c extending between an outlet opening 439a and a capped outlet end 439b. The outlet manifold 435 can also include an outlet divider 458 that separates the collection section 439c into a first outlet volume 460a and a second outlet volume 460b. The outlet divider 458 also separates the outlet opening 439a into a first outlet port 462a and a second outlet port 462b.

The inlet and outlet dividers 448, 458 cooperate to separate the internal channels 144 (FIG. 1C) of individual heat exchange elements 432 into a first channel portion 444a corresponding to the first inlet/outlet volumes 450a, 460a and a second channel portion 444b corresponding to the second inlet/outlet volumes 450b, 460b. Thus, the first inlet volume 450a, the first channel portion 444a, and the first outlet volume 460a form a first flow path of the heat exchanger 418. Similarly, the second inlet volume 450b, the second channel portion 444b, and the second outlet volume 460b form a second flow path of the heat exchanger 418. The first and second flow paths are isolated from each other and arranged along the air flow path 117.

In operation, the heat exchanger 418 can receive a first working fluid portion via the first inlet port 452a, as indicated by arrow 470a, and a second working fluid portion via the second inlet port 452b, as indicated by arrow 472a. The first and second inlet volumes 450a-b distribute the first and second working fluid portions to the first and second channel portions 444a-b, respectively. The first and second working fluid portions flow across the heat exchange elements 432, as indicated by arrows 470b and 472b, respectively. As the first and second working fluid portions flow across the heat exchange elements 432, they absorb heat from the cooling air flowing past the fins 442. The first and second outlet volumes 460a-b collect the heated first and second working fluid portions and returns them to the heat removal system 104 (FIG. 1A) via the first and second outlet ports 462a and 462b, respectively, as indicated by arrows 470c and 472c, respectively.

The first and second working fluid portions can have different physical characteristics. For example, in one embodiment, the first working fluid portion can have a mass flow rate that is less than the second working fluid portion. In another embodiment, the first working fluid portion can have a higher heat transfer coefficient than the second working fluid portion. In a further embodiment, the first working fluid portion can have a lower boiling point than the second working fluid portion. In yet another embodiment, the first working fluid portion can have a higher heat of vaporization than the second working fluid portion.

By controlling the physical characteristics of the first and second working fluid portions, the heat exchanger 418 can have improved heat transfer performance compared to conventional heat exchangers. The inventor has recognized that if the same working fluid is flowing through all the internal channels of the heat exchange elements 432, the working fluid in those channels proximate to the incoming cooling air is likely to be completely vaporized, while the working fluid in other channels spaced apart from the incoming cooling air may still be in liquid phase. Thus, by selecting appropriate heat transfer characteristics of the first and second working fluids, an operator can improve the heat transfer between the working fluid and the cooling air.

Although the inlet divider 448 and the outlet divider 458 are illustrated in FIG. 4 as being generally perpendicular to the air flow path 117, in other embodiments, at least one of the inlet divider 448 and the outlet divider 458 can be canted relative to the air flow path 117. In further embodiments, at least one of the inlet divider 448 and the outlet divider 458 can be omitted, and/or at least one of the first and second inlet/outlet volumes 450a-b, 460a-b can be standalone structures. For example, the first and second inlet volumes 450a-b can each include a generally tubular structure and spaced apart from each other.

Figure 5:
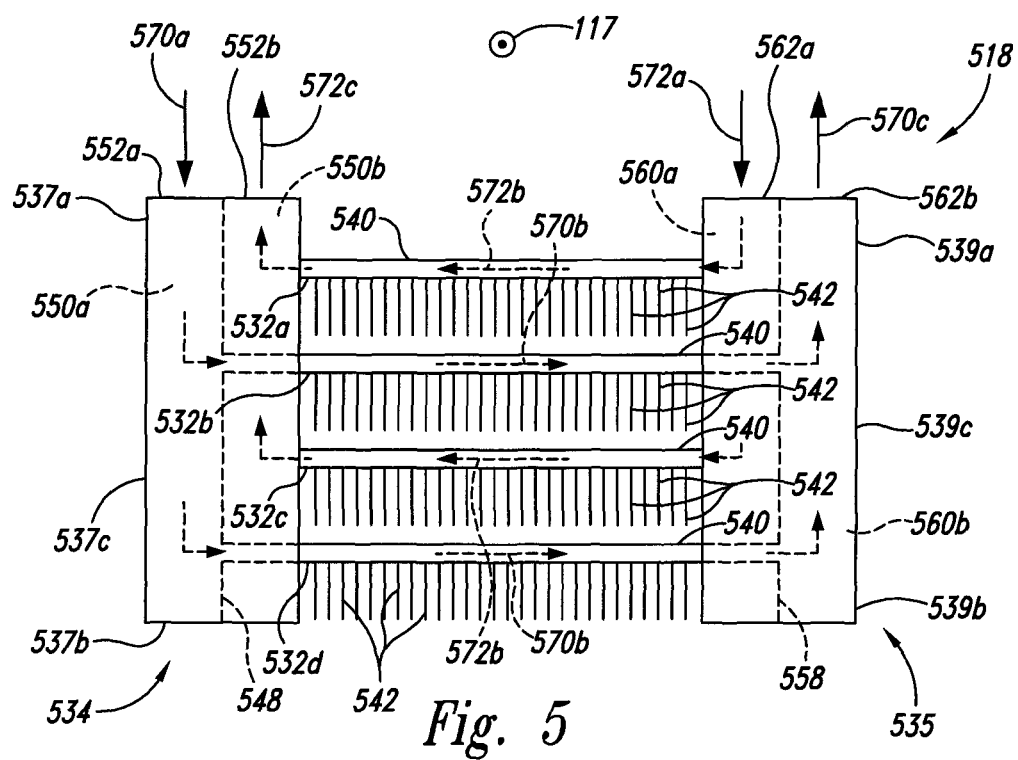
FIG. 5 is a top view of a heat exchanger having counter-flowing working fluids configured in accordance with a further embodiment of the invention and suitable for use in the computer system of FIG. 1A.

FIG. 5 is a top view of a heat exchanger 518 configured in accordance with a further embodiment of the invention and suitable for use in the computer system 100 of FIG. 1A. Many features of the heat exchanger 518 can be at least generally similar in structure and function to the heat exchangers 118 describe above. For example, the heat exchanger 518 can include a plurality of heat exchange elements 532 (identified individually as first, second, third, and fourth heat exchange elements 532a-d, respectively) extending between a first manifold 534 and a second manifold 535. The individual heat exchange elements 532 can include a passage portion 540 and have a plurality of fins 542 extending from the passage portion 540. The passage portion 540 can be generally similar to the passage portion 140 of FIGS. 1B and 1C, or FIG. 2.

The first manifold 534 can include a first intermediate section 537c extending between a first opening 537a and a capped first end 537b. The first manifold 534 can also include a first divider 548 extending between the first opening 537a and the first end 537b. The first divider 548 separates the first intermediate section 537c into a first distribution volume 550a and a first collection volume 550b. The first divider 548 also separates the first opening 537a into a first inlet port 552a and a first outlet port 552b.

The first distribution volume 550a and the first collection volume 550b are in fluid communication with only a portion of the heat exchange elements 532. For example, in the illustrated embodiment, the first distribution volume 550a is in fluid communication with the second and fourth heat exchange elements 532b, 532d, and the first collection volume 550b is in fluid communication with the first and third heat exchange elements 532a, 532c. In other embodiments, the first manifold 534 can also have other flow configurations.

The second manifold 535 can include a second intermediate section 539c extending between a second opening 539a and a capped second end 539b. The second manifold 535 can also include a second divider 558 extending between the second opening 539a and the second end 539b. The second divider 558 separates the second intermediate section 539c into a second distribution volume 560a and a second collection volume 560b. The second divider 558 also separates the second opening 539a into a second inlet port 562a and a second outlet port 562b.

The second distribution volume 560a and the second collection volume 560b are in fluid communication with only a portion of the heat exchange elements 532. For example, in the illustrated embodiment, the second distribution volume 560a is in fluid communication with the first and third heat exchange elements 532a, 532c, and the second collection volume 560b is in fluid communication with the second and fourth heat exchange elements 532b, 532d. In other embodiments, the second manifold 535 can also have other flow configurations.

The heat exchanger 518 can thus have a first flow path from the first inlet port 552a to the second outlet port 562b via the first distribution volume 550a, the second and fourth heat exchange elements 532b, 532d, and the second collection volume 560b. The heat exchanger 518 can also have a second flow path from the second inlet port 562a to the first outlet port 552b via the second distribution volume 560a, the first and third heat exchange elements 532a, 532c, and the first collection volume 550b.

In operation, the heat exchanger 518 can receive a first working fluid portion via the first inlet port 552a, as indicated by arrow 570a, and a second working fluid portion via the second inlet port 562a, as indicated by arrow 572a. The first and second distribution volumes 550a, 560a distribute the first and second working fluid portions to corresponding heat exchange elements 532. The first working fluid portion then flows across the second and fourth heat exchange elements 532b, 532d in a first direction, as indicated by arrow 570b. The second working fluid portion then flows across the first and third heat exchange elements 532a, 532c in a second direction, as indicated by arrow 572b. In the illustrated embodiment, the second direction is generally opposite the first direction. In other embodiments, the first and second directions can form an angle of about 120° to about 180°. As the first and second working fluid portions flow across the heat exchange elements 532, the cooling air flowing past the fins 542 heats the first and second working fluid portions. The first and second collection volumes 550b, 560b collect the heated first and second working fluid portions and return them to the heat removal system 104 (FIG. 1A) via the first and second outlet ports 552b, 562b, as indicated by arrows 570c, 572c, respectively.

By flowing the first and second working fluid portions in generally opposite directions, the heat exchanger 518 can have improved heat transfer efficiency compared to conventional heat exchangers. The inventor has recognized that the heat transfer efficiency decreases as the first and/or second portions of working fluid flow across the heat exchange elements. Thus, if the first and second working fluid portions flow in the same direction, one side of the heat exchanger 518 may have insufficient heat transfer. However, by alternating the flow directions of the first and second working fluid portions, the heat transfer efficiency between the first and second working fluid portions and the cooling air can be improved.

From the foregoing, it will be appreciated that specific embodiments of the invention have been described herein for purposes of illustration, but that various modifications may be made without deviating from the spirit and scope of the invention. For example, the heat exchangers shown in FIGS. 4 and 5 can also incorporate the heat exchange elements shown in FIGS. 2 and 3. In another example, the heat exchanger shown in FIG. 1B can also incorporate the inlet/outlet manifolds of FIG. 4 or FIG. 5. Further, while advantages associated with certain embodiments of the invention have been described in the context of those embodiments, other embodiments may also exhibit such advantages, and not all embodiments need necessarily exhibit such advantages to fall within the scope of the invention. Accordingly, the invention is not limited, except as by the appended claims.

I claim:

1. A computer system, comprising:
a computer cabinet having a plurality of computer module compartments positioned between an air inlet and an air outlet, wherein the air inlet, the air outlet, and the computer module compartments define an air flow path through the computer cabinet;
a heat exchanger positioned between two adjacent computer module compartments, the heat exchanger including:
an inlet manifold having an inlet divider separating the inlet manifold into a first inlet volume and a second inlet volume;
an outlet manifold spaced apart from the inlet manifold and having an outlet divider separating the outlet manifold into a first outlet volume and a second outlet volume; and
a plurality of heat exchange elements extending between the inlet manifold and the outlet manifold, wherein each individual heat exchange element includes a plurality of internal channels extending from a first end portion to a second end portion;
wherein the inlet divider cooperates with the first end portion and the outlet divider cooperates with the second end portion to separate the internal channels of each individual heat exchange element into a first channel portion in fluid communication with the first inlet volume and the first outlet volume, and a second channel portion in fluid communication with the second inlet volume and the second outlet volume;
wherein the first inlet volume, the first channel portion, and the first outlet volume form a first flow path, and wherein the second inlet volume, the second channel portion, and the second outlet volume form a second flow path in fluid isolation from the first flow path.

2. The computer system of claim 1 wherein the first and second flow paths are arranged sequentially along the air flow path.

3. A computer system, comprising:
a computer cabinet having a plurality of computer module compartments positioned between an air inlet and an air outlet, wherein the air inlet, the air outlet, and the computer module compartments define an air flow path through the computer cabinet; and
a heat exchanger positioned between two adjacent computer module compartments, the heat exchanger including:
a first flow path and a second flow path in fluid isolation from the first flow path;
an inlet manifold having an inlet divider separating the inlet manifold into a first inlet volume and a second inlet volume;
an outlet manifold having an outlet divider separating the outlet manifold into a first outlet volume and a second outlet volume; and
a plurality of heat exchange elements positioned between the inlet manifold and the outlet manifold, wherein each of the individual heat exchange elements includes a passage portion having a first channel portion and a second channel portion, wherein the first channel portion is in fluid communication with the first inlet volume and the first outlet volume, and wherein the second channel portion is in fluid communication with the second inlet volume and the second outlet volume.

4. The computer system of claim 3 wherein the first inlet volume, the first channel portion, and the first outlet volume at least partially define the first flow path, and wherein the second inlet volume, the second channel portion, and the second outlet volume at least partially define the second flow path.

5. The computer system of claim 3, further comprising a first working fluid portion in the first flow path and a second working fluid portion in the second flow path, and wherein the first working fluid portion and the second working fluid portion have different physical characteristics.

6. The computer system of claim 5 wherein the first working fluid portion has at least one of a higher flow rate, a higher heat transfer coefficient, a lower boiling point, a higher heat of vaporization than the second working fluid portion.

7. A method for operating a computer cabinet having a plurality of computer module compartments positioned between an air inlet and an air outlet and a heat exchanger positioned between two adjacent computer module compartments, the method comprising: flowing a first working fluid portion along a first inlet volume in an inlet manifold of the heat exchanger; flowing a second working fluid portion along a second inlet volume in the inlet manifold, wherein the inlet manifold includes an inlet divider separating the inlet manifold into the first inlet volume and the second inlet volume, and wherein the first and second inlet volumes are in fluid isolation from each other; flowing the first working fluid portion from the first inlet volume along a first flow path in a first internal channel of an individual heat exchange element of the heat exchanger; flowing the second working fluid portion from the second inlet volume along a second flow path in a second internal channel of the individual heat exchange element of the heat exchanger, the first and second internal channels being in fluid isolation from each other; flowing the first working fluid portion from the first internal channel into a first outlet volume of an outlet manifold of the heat exchanger; flowing the second working fluid portion from the second internal channel into a second outlet volume of the outlet manifold, wherein the outlet manifold includes an outlet divider separating the outlet manifold into the first outlet volume and the second outlet volume, and wherein the first and second outlet volumes are in fluid isolation from each other; flowing air through the heat exchanger and past the first and second internal channels; and controlling at least one characteristic of at least one of the first and second working fluid portions.

8. The method of claim 7 wherein controlling at least one characteristic includes controlling a flow rate, a heat transfer coefficient, a boiling point, and/or a heat of vaporization of the first and/or second working fluid portions.

* * * * *